United States Patent
Inokuchi et al.

(10) Patent No.: US 7,203,141 B2
(45) Date of Patent: Apr. 10, 2007

(54) RECORDING MEDIUM, RECORDING METHOD, RECORDING DEVICE, AND REPRODUCTION METHOD AND REPRODUCER

(75) Inventors: Tatsuya Inokuchi, Tokyo (JP); Yoichiro Sako, Tokyo (JP); Takashi Kihara, Chiba (JP); Shunsuke Furukawa, Tokyo (JP); Yoriaki Kanada, Kanagawa (JP); Akiya Saito, Kanagawa (JP); Toru Aida, Kanagawa (JP); Tatsushi Sano, Kanagawa (JP); Toshihiko Senno, Kanagawa (JP); Yoshinobu Usui, Kanagawa (JP)

(73) Assignees: Sony Corporation, Tokyo (JP); Sony Disc & Digital Solutions Inc., Tokyo (JP)

( * ) Notice: Subject to any disclaimer, the term of this patent is extended or adjusted under 35 U.S.C. 154(b) by 65 days.

(21) Appl. No.: 10/511,271

(22) PCT Filed: May 20, 2003

(86) PCT No.: PCT/JP03/06258

§ 371 (c)(1),
(2), (4) Date: Oct. 20, 2004

(87) PCT Pub. No.: WO03/098625

PCT Pub. Date: Nov. 27, 2003

(65) Prior Publication Data

US 2005/0226132 A1    Oct. 13, 2005

(30) Foreign Application Priority Data

May 21, 2002    (JP)    .............................. 2002-146327

(51) Int. Cl.
*G11B 21/08*    (2006.01)
(52) U.S. Cl. .............................. 369/47.19; 369/53.35; 369/53.21
(58) Field of Classification Search ..................... None
See application file for complete search history.

(56) References Cited

U.S. PATENT DOCUMENTS 7,055,082 B2 *  5/2006  Mori et al. ................. 714/768
2004/0202082 A1  10/2004  Sako et al.

FOREIGN PATENT DOCUMENTS

| JP | 9-288864 | 11/1997 |
|----|----------|---------|
| JP | 2000-106668 | 4/2000 |
| JP | 2002-367282 | 12/2002 |

* cited by examiner

*Primary Examiner*—Wayne Young
*Assistant Examiner*—Minerva Rivero
(74) *Attorney, Agent, or Firm*—Oblon, Spivak, McClelland, Maier & Neustadt, P.C.

(57) ABSTRACT

A recording medium has a first area in which data encoded with a first error correction code is recorded and a second area in which data encoded with the first error correction code and data decodable with a second error correction code that is different from the first error correction code are mixedly recorded. Data that causes the cumulated value of a DC component per unit period of data reproduced from the second area to deviate is recorded in the second area.

25 Claims, 13 Drawing Sheets

Fig. 5

| DATA / SYMBOL FRAME | L0 | | R0 | | L1 | | R1 | | L2 | | R2 | |
|---|---|---|---|---|---|---|---|---|---|---|---|---|
| | D0B | D0A | D1B | D1A | D2B | D2A | D3B | D3A | D4B | D4A | D5B | D5A |
| -190 | | | | | | | | | | | | |
| -187 | | | | | | | | | | | | |
| -184 | | | | | | | | | | | | |
| -181 | | | | | | | | | | | | |
| -178 | | | | | | | S20 | | | | | |
| -175 | | | | | | | | S19 | | | | |
| -172 | | | | | | | | | | | | |
| -169 | | | | | | | | | | | | |
| -166 | | | | | | | | | | | | |
| -163 | | | | | | | | | | | | |
| -160 | | | | | S14 | | | | | | | |
| -157 | | | | | | S13 | | | | | | |
| -144 | | | | | | | | | | | | |
| -141 | | | | | | | | | | | | |
| -138 | | | | | | | | | | | S10 | |
| -135 | | | | | | | | | | | | S9 |
| -132 | | | S8 | | | | | | | | | |
| -129 | | | | S7 | | | | | | | | |
| -126 | | | | | | | | | | | | |
| -123 | | | | | | | | | | | | |
| -120 | | | | | | | | | S4 | | | |
| -117 | | | | | | | | | | S3 | | |
| -114 | S2 | | | | | | | | | | | |
| -111 | | S1 | | | | | | | | | | |

Fig. 6

| DATA / SYMBOL FRAME | L3 | | R3 | | L4 | | R4 | | L5 | | R5 | |
|---|---|---|---|---|---|---|---|---|---|---|---|---|
| | D6B | D6A | D7B | D7A | D8B | D8A | D9B | D9A | D10B | D10A | D11B | D11A |
| −190 | | | | | | | | | | S24 | | |
| −187 | | | | | | | | | | | | S23 |
| −184 | | | S22 | | | | | | | | | |
| −181 | | | | S21 | | | | | | | | |
| −178 | | | | | | | | | | | | |
| −175 | | | | | | | | | | | | |
| −172 | | | | | | | | | | S18 | | |
| −169 | | | | | | | | | | | S17 | |
| −166 | S16 | | | | | | | | | | | |
| −163 | | S15 | | | | | | | | | | |
| −160 | | | | | | | | | | | | |
| −157 | | | | | | | | | | | | |
| −144 | | | | | | | | S12 | | | | |
| −141 | | | | | | | | | S11 | | | |
| −138 | | | | | | | | | | | | |
| −135 | | | | | | | | | | | | |
| −132 | | | | | | | | | | | | |
| −129 | | | | | | | | | | | | |
| −126 | | | | | | S6 | | | | | | |
| −123 | | | | | | | S5 | | | | | |
| −120 | | | | | | | | | | | | |
| −117 | | | | | | | | | | | | |
| −114 | | | | | | | | | | | | |
| −111 | | | | | | | | | | | | |

Fig. 7

| DATA / SYMBOL FRAME | L0 | | R0 | | L1 | | R1 | | L2 | | R2 | |
|---|---|---|---|---|---|---|---|---|---|---|---|---|
| | D0B | D0A | D1B | D1A | D2B | D2A | D3B | D3A | D4B | D4A | D5B | D5A |
| −156 | S2 | S1 | S8 | S7 | | | | | S4 | S3 | S10 | S9 |
| −154 | | | | | S14 | S13 | S20 | S19 | | | | |
| −153 | S2 | S1 | S8 | S7 | | | | | S4 | S3 | S10 | S9 |
| −151 | | | | | S14 | S13 | S20 | S19 | | | | |
| −150 | S2 | S1 | S8 | S7 | | | | | S4 | S3 | S10 | S9 |
| −148 | | | | | S14 | S13 | S20 | S19 | | | | |
| −147 | S2 | S1 | S8 | S7 | | | | | S4 | S3 | S10 | S9 |
| −145 | | | | | S14 | S13 | S20 | S19 | | | | |

Fig. 8

| DATA / SYMBOL FRAME | L0 | | R0 | | L1 | | R1 | | L2 | | R2 | |
|---|---|---|---|---|---|---|---|---|---|---|---|---|
| | D6B | D6A | D7B | D7A | D8B | D8 | D9B | D9A | D10B | D10A | D11B | D11A |
| −156 | | | | | S6 | S5 | S12 | S11 | | | | |
| −154 | S16 | S15 | S22 | S21 | | | | | S18 | S17 | S24 | S23 |
| −153 | | | | | S6 | S5 | S12 | S11 | | | | |
| −151 | S16 | S15 | S22 | S21 | | | | | S18 | S17 | S24 | S23 |
| −150 | | | | | S6 | S5 | S12 | S11 | | | | |
| −148 | S16 | S15 | S22 | S21 | | | | | S18 | S17 | S24 | S23 |
| −147 | | | | | S6 | S5 | S12 | S11 | | | | |
| −145 | S16 | S15 | S22 | S21 | | | | | S18 | S17 | S24 | S23 |

Fig. 9

| DATA<br>SYMBOL<br>FRAME | L0 | | R0 | | L1 | | R1 | | L2 | | R2 | |
|---|---|---|---|---|---|---|---|---|---|---|---|---|
| | D0B | D0A | D1B | D1A | D2B | D2A | D3B | D3A | D4B | D4A | D5B | D5A |
| 0 | S2 | S1 | S8 | S7 | | | | | S4 | S3 | S10 | S9 |
| 1 | | | | | | | | | | | | |
| 2 | | | | | S14 | S13 | S20 | S19 | | | | |

Fig. 10

| DATA<br>SYMBOL<br>FRAME | L3 | | R3 | | L4 | | R4 | | L5 | | R5 | |
|---|---|---|---|---|---|---|---|---|---|---|---|---|
| | D6B | D6A | D7B | D7A | D8B | D8A | D9B | D9A | D10B | D10A | D11B | D11A |
| 0 | | | | | S6 | S5 | S12 | S11 | | | | |
| 1 | | | | | | | | | | | | |
| 2 | S16 | S15 | S22 | S21 | | | | | S18 | S17 | S24 | S23 |

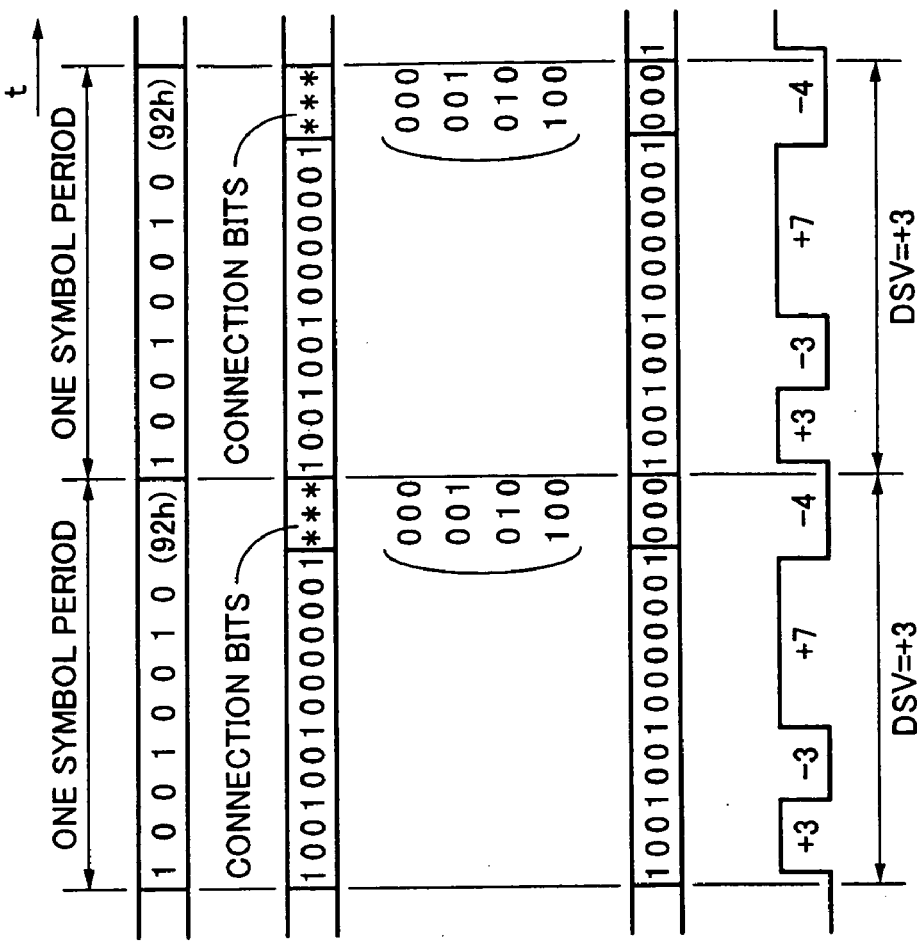

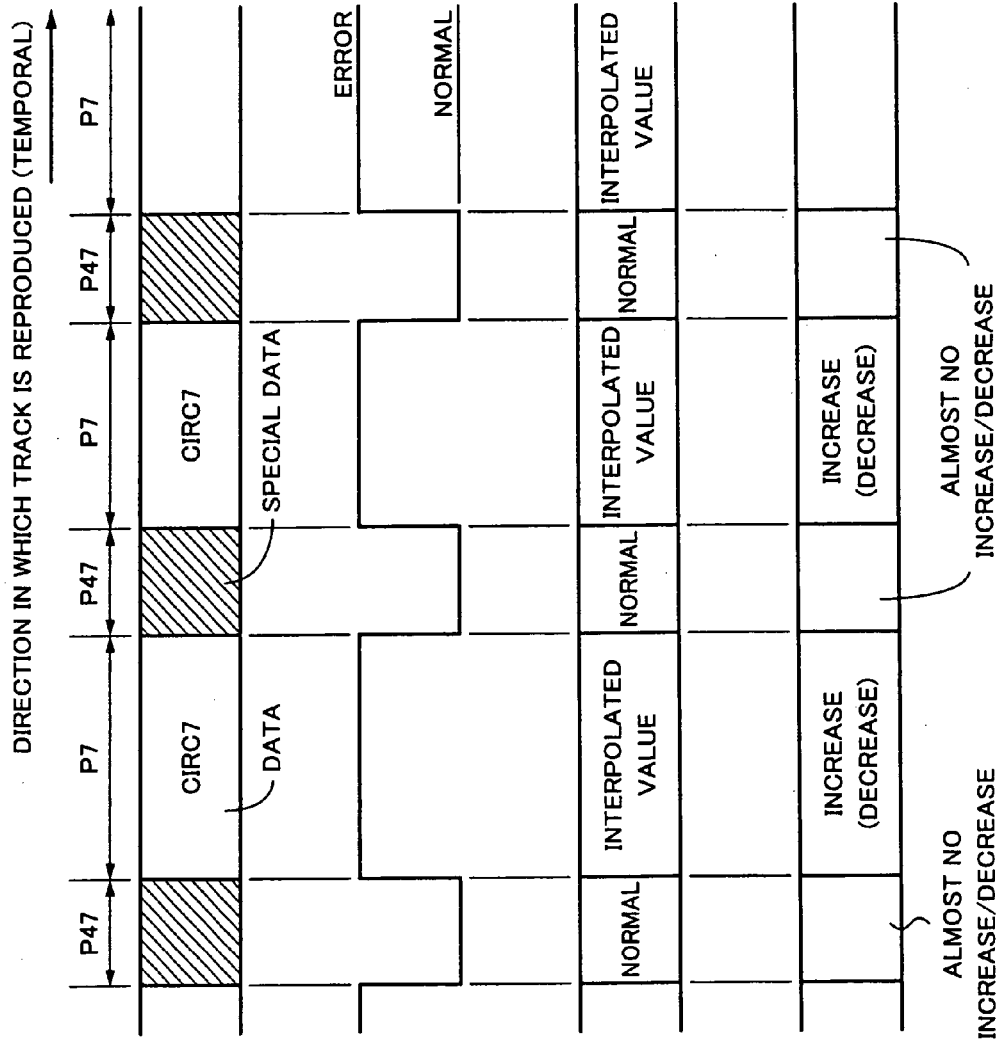

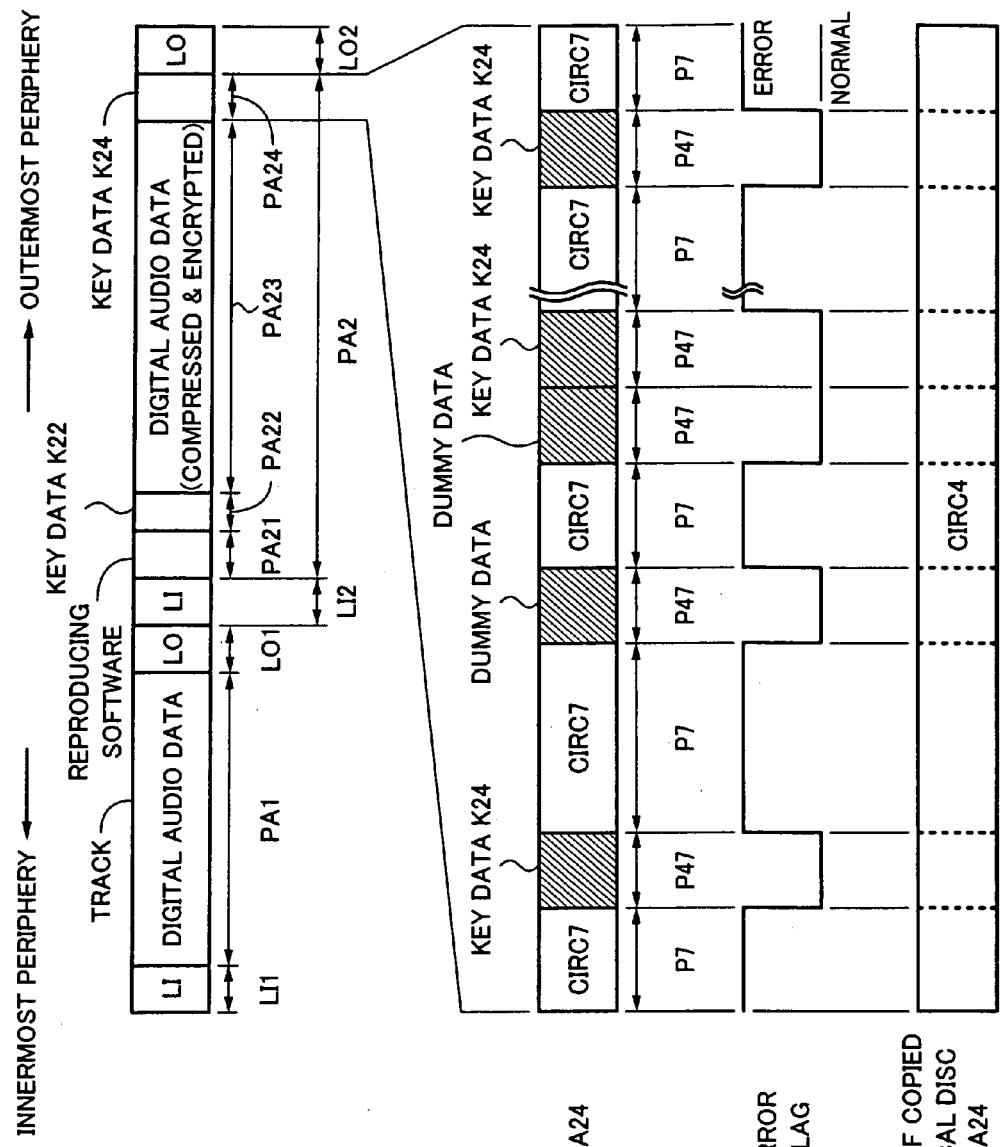

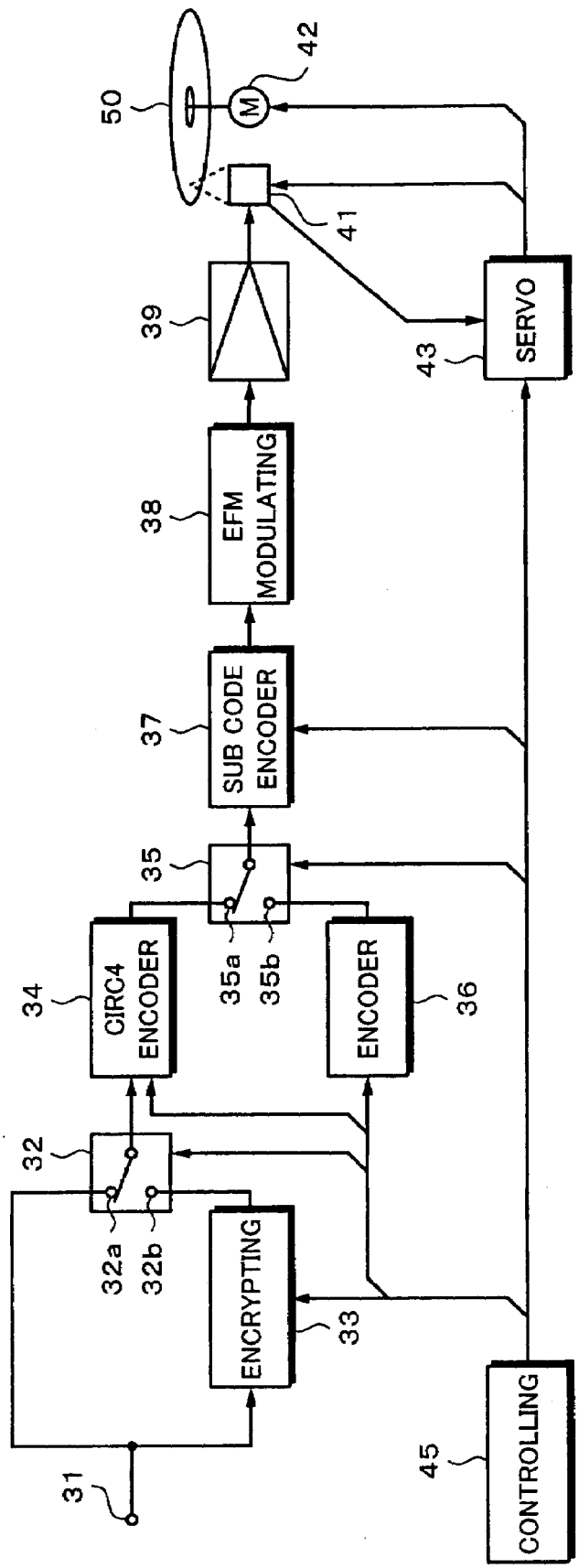

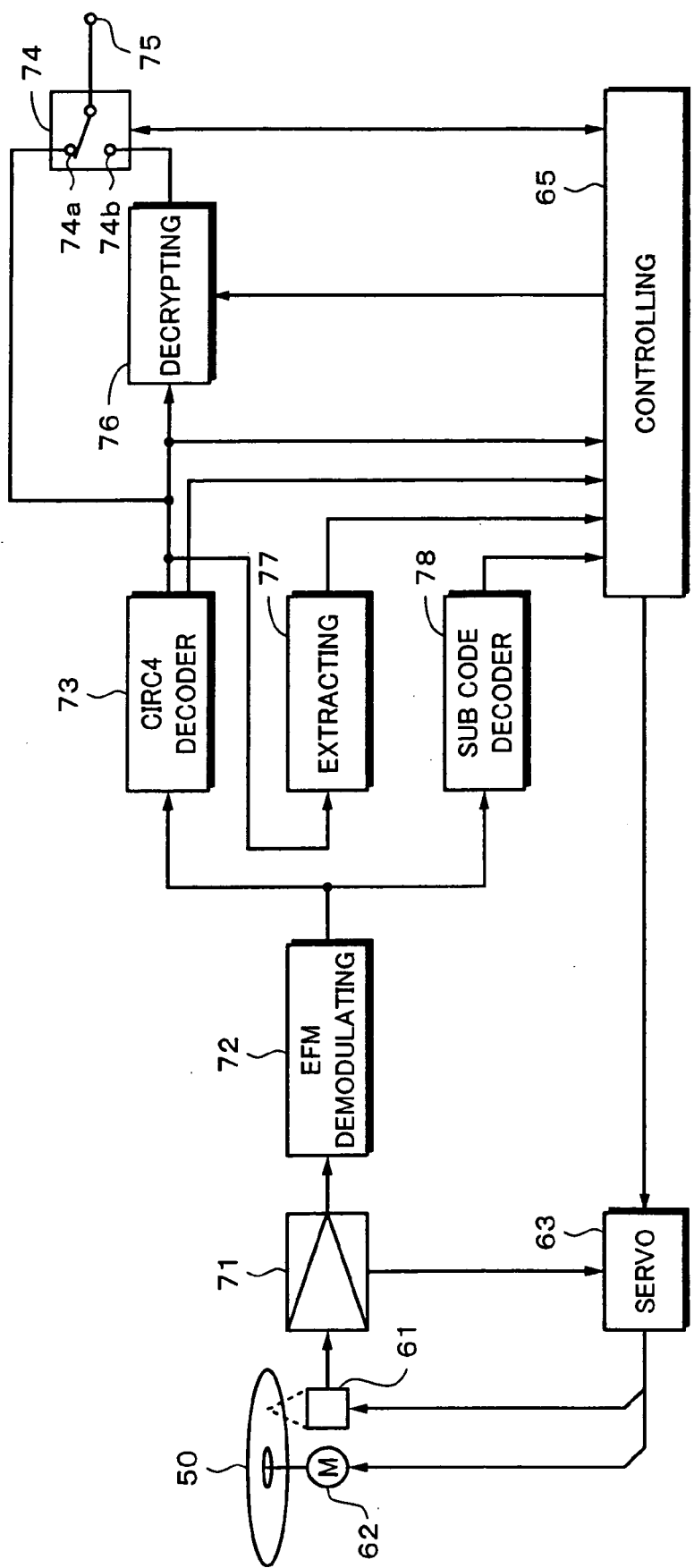

ized so that
RECORDING MEDIUM, RECORDING METHOD, RECORDING DEVICE, AND REPRODUCTION METHOD AND REPRODUCER

TECHNICAL FIELD

The present invention relates to a recording medium, a recording method, a recording apparatus, a reproducing method, and a reproducing apparatus for digital data.

BACKGROUND ART

Since CDs (Compact Discs) are easy to produce, inexpensive, and easy to handle, they have widespread as mediums for storing various types of data such as digital audio data and video data, computer programs, and so forth.

In recent years, as the performance of personal computers has been improved and a CD-R (CD-Recordable) disc and a CD-RW (CD-Rewritable) disc have come out, digital data recorded on for example a CD-DA (CD-Digital Audio) disc can be easily copied. This copying operation is illegal because it disregards copyright of the digital data. Thus, it is necessary to protect copyright of digital data recorded on the CD.

From such a point of view, as new mediums, a DVD-Audio (Digital Versatile Disc-Audio) disc, an SACD (Super Audio CD) disc, and so forth have been standardized so that permission or prohibition for their copy operations can be designated. However, since the formats of the DVD-Audio disc and SACD disc are not compatible with the format of the CD, the new mediums require their dedicated drive devices. They prevent these discs to become widespread.

Thus, a recording medium, a recording method or a reproducing method, and a recording apparatus or a reproducing apparatus that provide security, namely a copyright protecting function while having compatibility with a conventional drive device are desired. However, if these mediums have compatibility with a conventional drive device, their copyright protection function will not work. Thus, data that is read from such a recording medium can be directly copied to a CD-R disc or a CD-RW disc.

In addition, there is a need to read a part of data from for example a DDCD (Double Density CD) on which the data has been recorded with ECC (Error Checking and correcting Code) using a conventional CD drive device. However, the need has not been satisfied from a view point of copyright protection.

From the foregoing point of view, the present invention provides a CD that has high compatibility with a conventional CD and prevents its contents from being illegally copied. In the following description, it is assumed that a CD includes a CD-DA and a CD-ROM.

DISCLOSURE OF THE INVENTION

Claim 1 of the present invention is a recording medium having a first area on which data that has been encoded with a first error correction code is recorded; and a second area on which data that has been encoded with the first error correction code and data that is decodable with a second error correction code that is different from the first error correction code are mixedly recorded, wherein data that causes the cumulated value of a DC component per unit period of the data reproduced from the second area to deviate is recorded in the second area.

Claim 7 of the present invention is a recording method, comprising the steps of recording data that has been encoded with a first error correction code to a first area of a recording medium; mixedly recording data that has been encoded with the first error correction code and data that is decodable with a second error correction code that is different from the first error correction code to a second area of the recording medium; and recording data that causes the cumulated value of a DC component per unit period of the data reproduced from the second area to deviate to the second area.

Claim 13 of the present invention is a recording apparatus, comprising a first encoding process portion for performing an encoding process including an error correction code encoding process for data that is input with a first error correction code; a second encoding process portion for performing a second encoding process including an error correction code encoding process with a second error correction code that is different from the first error correction code; a modulating process portion for receiving output data of the first encoding process portion and output data of the second encoding process portion, performing a modulating process for the output data of the first encoding process portion and the output data of the second encoding process portion, and performing a modulating process for modulating the output data of the second encoding process portion so that data that causes the cumulated value of a DC component per unit period of the output data of the second encoding process portion to deviate is contained in the output data of the second encoding process portion; and a recording portion for receiving output data of the modulating process portion and mixedly recording data encoded with the first error correction code and data decodable with the second error correction code, which is different from the first error correction code.

Claim 20 of the present invention is a reproducing apparatus, comprising a head portion for reading data from a recording medium having a first area on which data that has been encoded with a first error correction code is recorded and a second area on which data that has been encoded with the first error correction code and data that is decodable with a second error correction code that is different from the first error correction code are mixedly recorded, wherein data that causes the cumulated value of a DC component per unit period of the data reproduced from the second area to deviate is recorded in the second area; a decoding process portion for performing a decoding process for data that has been read from the head portion; an error correcting process portion for performing an error correcting process for output data of the decoding process portion with the first error correction code; a generating portion for decrypting key data in accordance with a process result of the error correcting process portion; and a decrypting portion for decrypting encrypted data that has been read from the first area and that has been output from the decoding process portion with the key data decrypted by the generating portion.

Claim 23 of the present invention is a reproducing method, comprising the steps of reading data from a recording medium having a first area on which data that has been encoded with a first error correction code is recorded and a second area on which data that has been encoded with the first error correction code and data that is decodable with a second error correction code that is different from the first error correction code are mixedly recorded, wherein data that causes the cumulated value of a DC component per unit period of the data reproduced from the second area to deviate is recorded in the second area; performing a decoding process for data that has been read; performing an error correcting process for the decoded data with the first error correction code; decrypting key data in accordance with a process result of the error correcting process; and decrypting encrypted data that has been read from the first area with the decrypted key data.

According to the present invention, a recording medium has a first area on which data encoded with a first error correction code is recorded and a second area on which data encoded with a second error correction code and data that can be decrypted with a second error correction code that is different from the first error correction code are mixedly recorded. Data that causes the cumulated value of a DC component per unit period of data that is reproduced to deviate is recorded in the second area. As a result, a decoding process for data recorded on the recording medium can be selectively performed.

BRIEF DESCRIPTION OF DRAWINGS

FIG. 5 is a schematic diagram showing a data arrangement describing the present invention.

FIG. 6 is a schematic diagram showing the data arrangement describing the present invention.

FIG. 7 is a schematic diagram showing the data arrangement describing the present invention.

FIG. 8 is a schematic diagram showing the data arrangement describing the present invention.

FIG. 9 is a schematic diagram showing the data arrangement describing the present invention.

FIG. 10 is a schematic diagram showing the data arrangement describing the present invention.

FIG. 11A to FIG. 11E are schematic diagrams describing a DSV process according to the present invention.

FIG. 12A to FIG. 12D are schematic diagrams describing an error correcting process according to the present invention.

FIG. 13A to FIG. 13D are schematic diagrams describing the structure and operation of an optical disc according to the present invention.

FIG. 14 is a block diagram showing a recording apparatus according to an embodiment of the present invention.

FIG. 15 is a block diagram showing a reproducing apparatus according to the present invention.

BEST MODE FOR CARRYING OUT THE INVENTION

Next, with reference to the accompanying drawings, a recording medium, a recording apparatus, and a reproducing apparatus according to the present invention will be described. First of all, a structure that is a premise of the present invention will be described.

(1) Error Correction Code of CD

An error correction code used in the current CD standard is called CIRC (Cross Interleaved Read-Solomon Code). In the CIRC error correction code, two Reed-Solomon code sequences referred to as C1 and C2 whose minimum distance is 5 are used.

Figure 1:
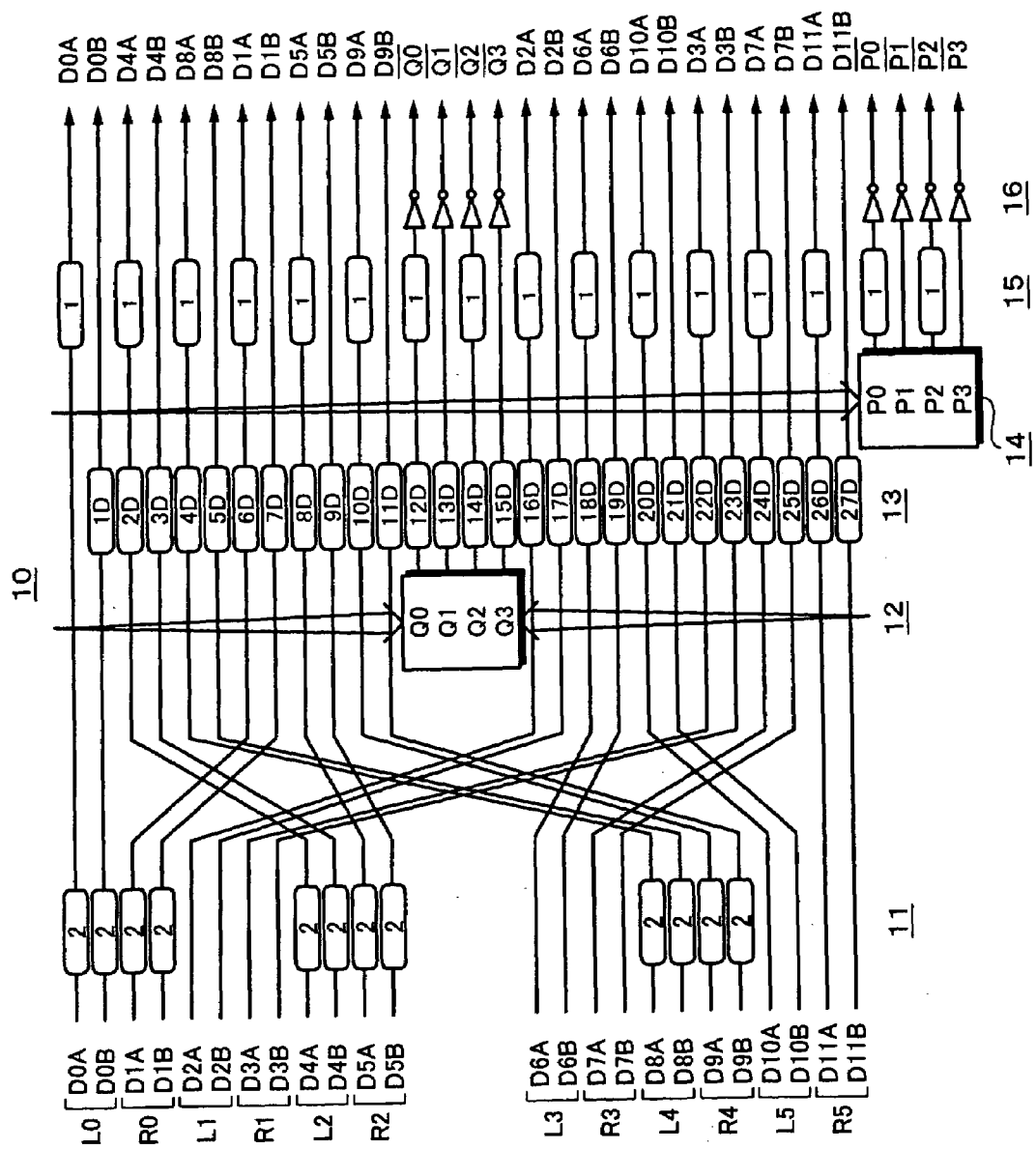
FIG. 1 is a systematic diagram describing the present invention.

FIG. 1 shows a CIRC encoder circuit 10 used in a recording apparatus for a CD. In a CD, six successive samples L0 to L5 of digital audio data on the left channel and six successive samples R0 to R5 of digital audio data on the right channel compose one frame. Each of the data L0 to L5 and R0 to R5 is composed of 16 bits. The data L0 to L5 and R0 to R5 are divided into high order eight bits D0A to D11A and low order eight bits D0B to D11B. Each of eight bit blocks D0A to D11B are called a symbol.

The symbols D0A to D11B are supplied to a delaying and scrambling circuit 11. The delaying and scrambling circuit 11 delays symbols of even-numbered samples by two symbols. In addition, the delaying and scrambling circuit 11 scrambles all the symbols. outputs of the delaying and scrambling circuit 11 are supplied to a C2 encoder circuit 12. The C2 encoder circuit 12 encodes the scrambled symbols with (28, 24, 5) Reed-Solomon codes on GF ($2^8$) and generates four-symbol Q parities Q0 to Q3. Outputs of the C2 encoder circuit 12 are supplied to an interleaving circuit 13. Assuming that a unit delay amount is denoted by D, symbols are delayed by delay amounts 0, D, 2D, ..., 27D that are different in arithmetic progression. The current CD standard prescribes D=4 frames. Adjacent symbols are spaced apart by four frames each. In the following description, a CIRC system with D=4 is referred to as "CIRC4 system".

Thereafter, outputs of the interleaving circuit 13 are supplied to a C1 encoder circuit 14. The C1 encoder circuit 14 encodes the symbols with (32, 28, 5) Reed-Solomon codes on GF ($2^8$). As a result, the C1 encoder circuit 14 generates four-symbol P parities P0 to P3. The outputs of the C1 encoder circuit 14 are also supplied to a delaying circuit 15. The delaying circuit 15 alternately delays symbols by one symbol. In addition, an inverter circuit 16 inverts the Q parities Q0 to Q3 and P parities P0 to P3. Outputs of the inverter circuit 16 are supplied as an encoded signal of the encoder circuit 10. The encoded signal is supplied to an EFM modulating circuit. An EFM modulated signal is recorded on a recordable optical disc or an original with which CDs are produced.

Figure 2:
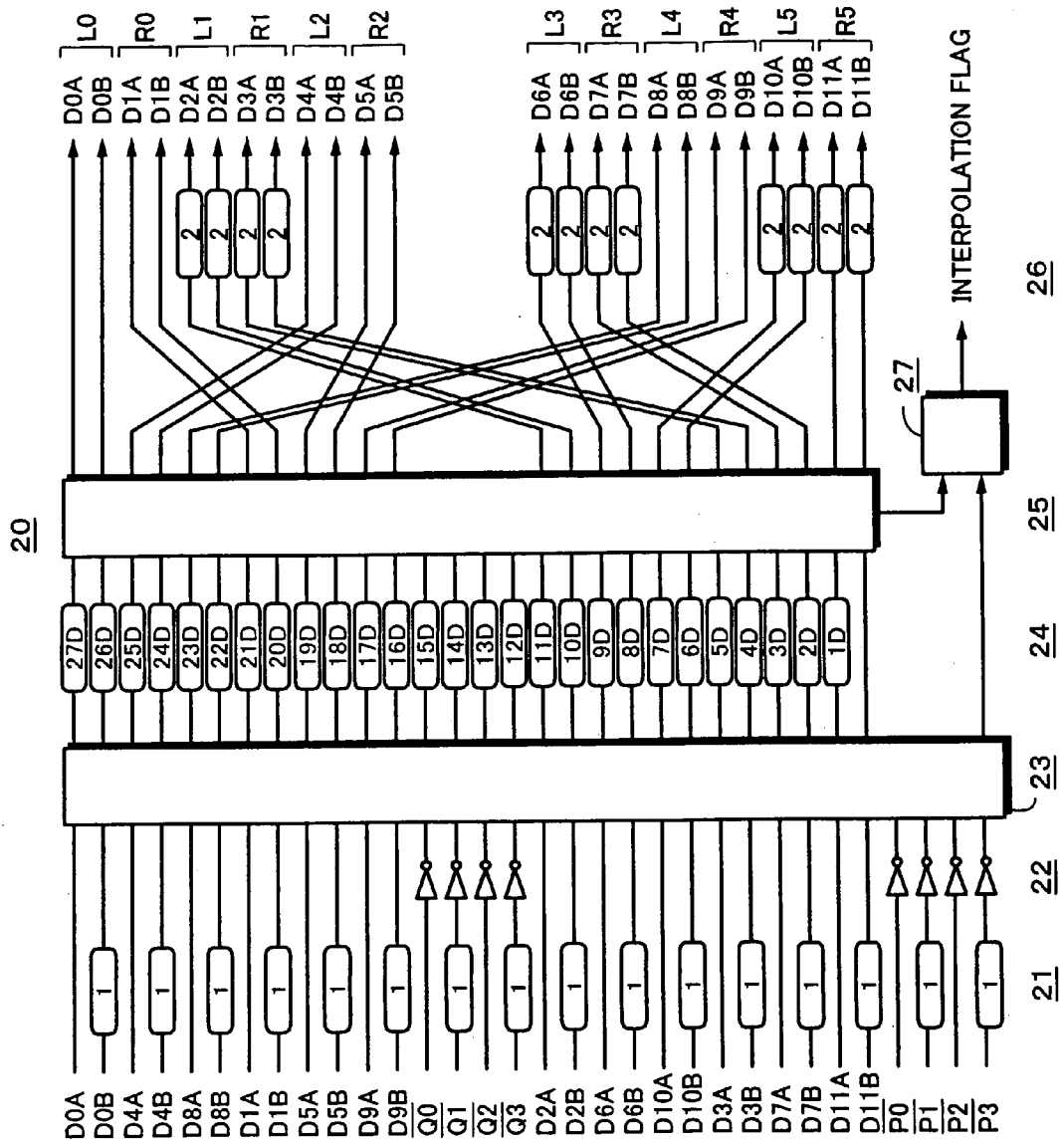
FIG. 2 is a systematic diagram describing the present invention.

FIG. 2 shows a CIRC decoder circuit 20 used in a reproducing apparatus. The decoder circuit 20 performs a complementary process of the encoder circuit 10. In other words, an EFM demodulating circuit demodulates an EFM modulated signal reproduced from an optical disc, in this example a CD, and outputs an original data sequence (encoded signal). The encoded signal that is an output signal of the EFM demodulating circuit is supplied to a delaying circuit 21. The delaying circuit 21 delays symbols that have not been delayed by the delaying circuit 15 of the encoder circuit 10 by one symbol each. As a result, the delaying circuit 21 relatively cancels the delays of the symbols made by the delaying circuit 15. In addition, an inverter circuit 22 re-inverts the symbols that have been inverted by the inverter circuit 16 of the encoder circuit 10. As a result, the encoded outputs of the C1 encoder circuit 14 are obtained.

A C1 decoder circuit 23 decodes the encoded outputs and outputs the original symbols. The decoded symbols are supplied to a deinterleaving circuit 24. The deinterleaving circuit 24 delays the symbols by delay amounts 27D, 26D, ..., D, and 0 that are different in arithmetic progression. As a result, the deinterleaving circuit 24 relatively cancels the delays of the symbols made by the interleaving circuit 13 of the encoder circuit 10. At that point, the delay amount D is 4.

Thereafter, outputs of the deinterleaving circuit 24 are supplied to a C2 decoder circuit 25. The C2 decoder circuit 25 decodes the output symbols of the deinterleaving circuit 24 and outputs the original symbols. The decoded symbols are supplied to a delaying and descrambling circuit 26. The delaying and descrambling circuit 26 descrambles all the symbols. In addition, the delaying and descrambling circuit 26 delays symbols of the odd-numbered samples by two symbols and outputs the original audio data L0 to R5 (symbols D0A to D11B). The foregoing process is executed for each frame. As a result, the original digital audio data is successively obtained. Thereafter, the digital audio data is converted into analog data and the original analog audio signals of left and right channels are obtained.

At that point, error flags are extracted from the C1 decoder circuit 23 and the C2 decoder circuit 25. The error flags are supplied to an interpolation flag generating circuit 27. The interpolation flag generating circuit 27 generates an error interpolation flag with the error flags. The interpolation flag causes erroneous data to be interpolated by an interpolating process such as pre-hold interpolation or average value interpolation.

The foregoing process is the CIRC4 error correcting process prescribed in the current CD standard. The DDCD standard and so forth prescribe an encoding system called CIRC7 system that uses an error correction code.

The encoder circuits 12 and 14 and the decoder circuits 23 and 25 according to the CIRC4 system are the same as those according to the CIRC7 system. However, the delay amount D of each of the interleaving circuit 13 and the deinterleaving circuit 24 in the CIRC7 system is seven frames (four frames in the CIRC4 system).

Thus, the interleave length in the CIRC7 system is larger than that in the CIRC4 system, the CIRC7 system has higher correction performance than the CIRC4 system against a burst error (that continues in data that is read from a CD as an optical disc due to a finger print adhered thereon or a scratch on a reading side thereof). Regardless of values of the original data L0 to R5, the C1 sequence in the CIRC4 system is the same as that in the CIRC7 system, whereas the C2 sequence in the CIRC4 system is different from that in the CIRC7 system.

Since the interleave length in the CIRC4 system is different from that in the CIRC7 system, when data is recorded on a CD as an optical disc in accordance with the CIRC4 system, a reproducing apparatus in accordance with the CIRC7 system cannot decode the data (namely, the apparatus cannot reproduce the data from the CD). Likewise, when data is recorded on an optical disc in accordance with the CIRC7 system, a reproducing apparatus in accordance with the CIRC4 system cannot decode the data from the disc (namely, the apparatus cannot reproduce the data from the disc).

However, when the original data L0 to R5 are arranged in a predetermined manner, regardless of whether data has been encoded in accordance with the CIRC4 error correcting system or the CIRC7 error correcting system, the data can be normally decoded.

Figure 3:
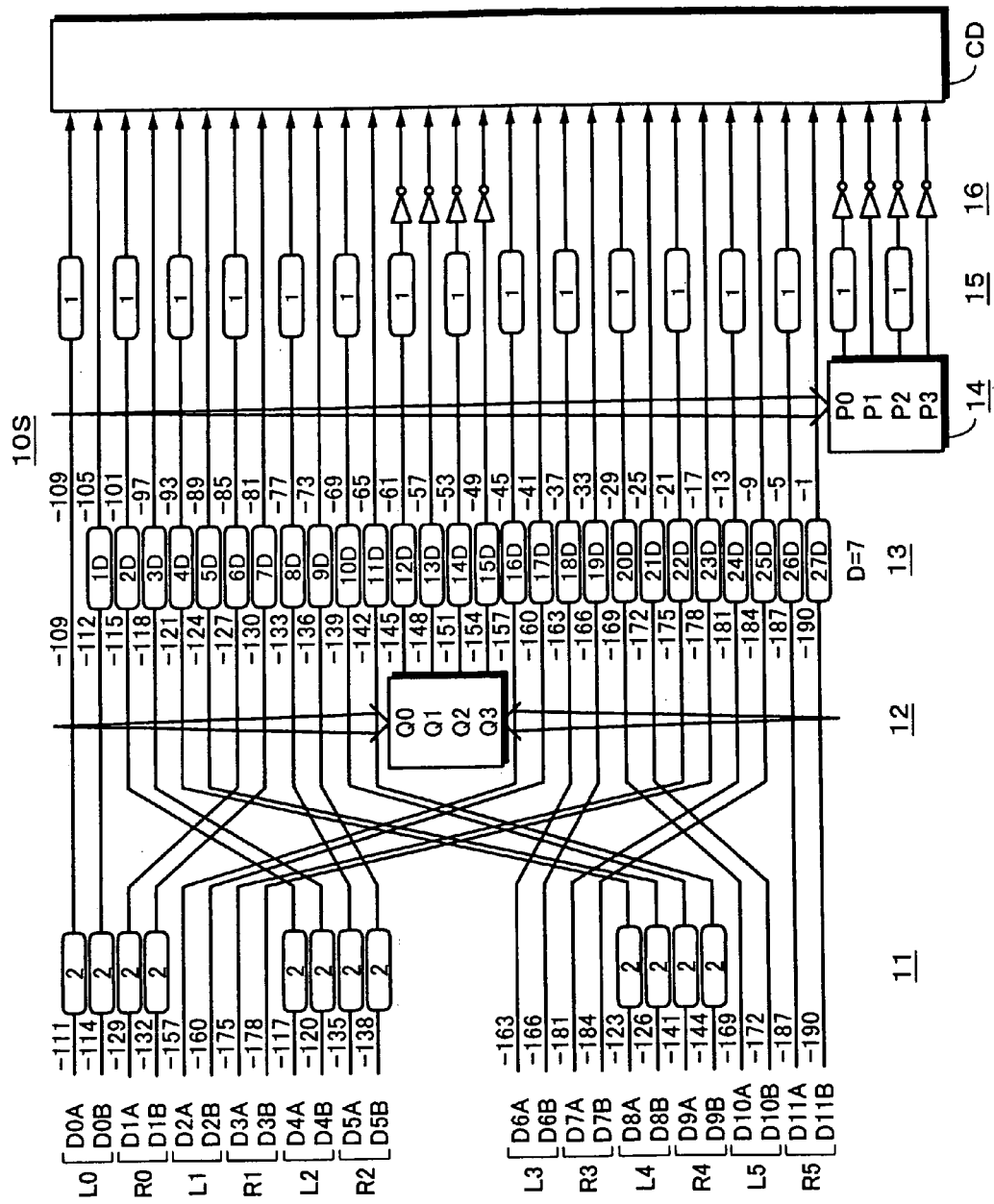
FIG. 3 is a systematic diagram describing the present invention.
Figure 4:
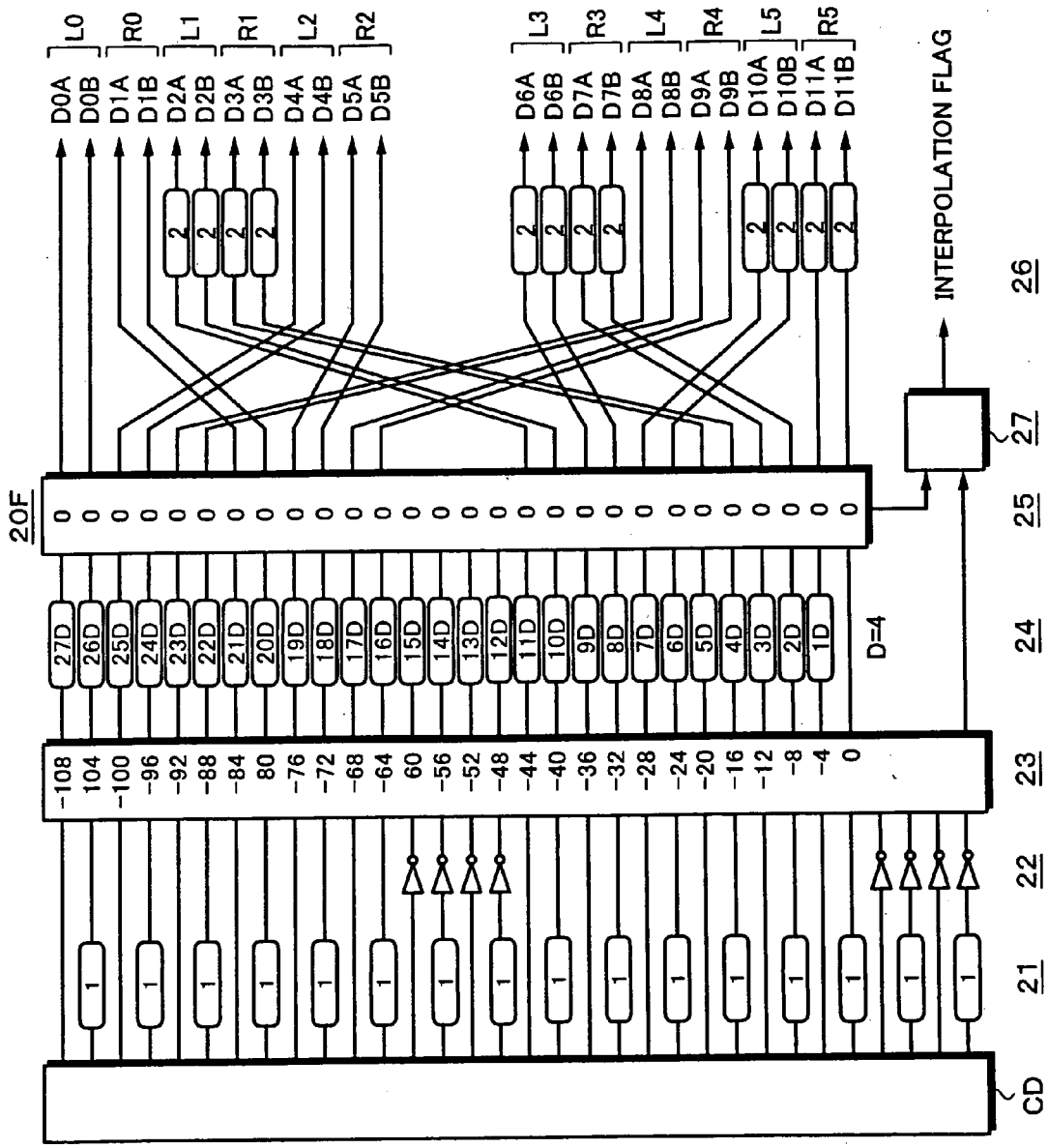
FIG. 4 is a systematic diagram describing the present invention.

FIG. 3 and FIG. 4 are schematic diagrams describing arrangements of data that can be decoded regardless of the CIRC4 system or the CIRC7 system. In this example, data is encoded in accordance with the CIRC7 system. The encoded data is recorded on an optical disc. The encoded data recorded on the optical disc is decoded in accordance with the CIRC4 system.

FIG. 3 shows an encoder circuit 10S in accordance with the CIRC7 system. The encoder circuit 10S has the same structure as the encoder circuit 10 described with FIG. 1. However, the interleaving circuit 13 of the encoder circuit 10S has a delay amount D of 7. FIG. 4 shows a decoder circuit 20F in accordance with the CIRC4 system. The decoder circuit 20F has the same structure as the decoder circuit 20 in accordance with the CIRC4 system. However, the deinterleaving circuit 24 of the decoder circuit 20F has a delay amount D of 4. A CD as an optical disc is interposed between the encoder circuit 10S in accordance with the CIRC7 system and the decoder circuit 20F in accordance with the CIRC4 system (in FIG. 3 and FIG. 4, one CD is shown in common; an EFM modulating circuit and an EFM demodulating circuit are omitted).

In FIG. 3 and FIG. 4, numerals represent offset amounts of individual frames. When a C2 decoder circuit 25 of the decoder circuit 20 outputs data S1 to S24 as outputs D0A to D1B, the offset amount (frame number) of a frame that contains the data S1 to S24 is called reference value 0. As a result, when the data S1 to S24 are output from the C1 decoder circuit 23, offset amounts are designated −108, −104, −100, . . . and 0 in accordance with delay times of the deinterleaving circuit 24.

Since delaying circuits 13 and 21 are disposed, the offset amounts for which the data S1 to S24 are output from the interleaving circuit 13 are −109, −105, −101, . . . , and so forth. The offset amounts for which the data S1 to S24 are output from the delaying and scrambling circuit 11 are −109, −112, −115, . . . , and −190 due to delay times of the interleaving circuit 13. Thus, the offset amounts for which the data S1 to S24 are input to the encoder circuit 10S are −111, −114, −129, . . . , and −190 due to the delaying and scrambling circuit 11.

Thus, when the data S1 to S24 are arranged for −190th to −111st frames as shown in FIG. 5 to FIG. 6 (data shown in FIG. 5 is followed by data shown in FIG. 6), the C2 decoder circuit 25 simultaneously outputs the data S1 to S24 as the current frame (0th frame). In FIG. 5 and FIG. 6, since blank data is not contained in the current frame, the blank data may be any data.

However, in reality, it should be noted that the Q parities Q0 to Q3 and the P parities P0 to P3 are added to the data S1 to S24, recorded, and reproduced and that these parities are dispersed to the data S1 through S24. When the data S1 to S24 are arranged to the −156th to −145th frames as shown in FIG. 7 and FIG. 8 (data shown in FIG. 8 is preceded by data shown in FIG. 7), the C2 decoder circuit 25 simultaneously outputs the data S1 to S24 as the current frame.

Thus, when the data S1 to S24 are arranged to the −190th to −111th frame as shown in FIG. 5 to FIG. 8, they are encoded in accordance with the CIRC7 system, and they are decoded in accordance with the CIRC4 system, then the C2 decoder circuit 25 simultaneously outputs the data S1 to S24 as the current frame. At that point, the error flag is not set.

The data S1 to S24 can be normally decoded and reproduced even in accordance with the CIRC7 system. The data S1 to S24 may have any values. In addition, the data S1 to S24 can be placed in any region of data that has been encoded in accordance with the CIRC7 system. In the following description, data or data arrangement like the data S1 to S24 that can be normally decoded in accordance with any of the CIRC4 system and the CIRC7 system is referred to as "special data".

The data S1 to S24 that are simultaneously output from the C2 decoder circuit 25 are delayed by the delaying and descrambling circuit 26 and are output from the decoder circuit 20F. Thus, as shown in FIG. 9 and FIG. 10 (data shown in FIG. 10 is preceded by data shown in FIG. 9), the decoder circuit 20F outputs the data S1 to S24 contained in the current frame (0th frame) and the second frame.

(2) DSV of CD

As shown in FIG. 11A, when the value of a symbol (original data) is for example 92h (where h represents hexadecimal notation), if the symbol is encoded in accordance with the CIRC7 system and the encoded symbol is converted into an EFM modulated signal, the channel bits (EFM modulated signal) are arranged as shown in FIG. 11B in accordance with conversion and modulation section in the CD standard. Connection bits or margin bits are inserted into a boundary of symbols.

The connection bits are inserted into the boundary so that the minimum duration Tmin of the channel bits becomes long and the maximum duration Tmax becomes short. In reality, the connection bits are inserted into the boundary so that two or more "0's" or "1's" are successive, but not more than 12 "0's" or "1's" are successive. Thus, the connection bits are any one of four types of bit patterns shown in FIG. 11C. In this case, a pattern "000" is selected in accordance with the foregoing condition.

Thus, in this case, the channel bits are represented as a bit pattern as shown in FIG. 11D. A cumulated value of a DC component per unit time, namely DSV (Digital Sum Variation), is obtained as shown in FIG. 11E. When one symbol has ended, the DSV increases by "3". When a symbol is regular digital audio data or the like, the sign and value of the DSV per symbol deviates. In addition, connection bits are selected so that the DSV converges at "0". Thus, the DSV converges in a predetermined range close to "0".

However, when for example symbols 92h are repeated in any method, the DSV increases by 3 per symbol. When the DSV increases (or decreases) and deviates from a predetermined range, the DSV affects asymmetry compensation of the reproducing circuit of a CD as an optical disc. Thus, data cannot be correctly reproduced from the CD.

(3) Structure According to Present Invention

FIG. 12A is an enlarged view showing a part of a track of an optical disc as a recording medium according to the present invention. The part of the track is divided into a plurality of areas. Any data that is encoded in accordance with the CIRC7 system is recorded in areas P7 that are alternative areas of the divided areas. Special data that can be normally decoded in accordance with any of the CIRC4 system and the CIRC7 system is recorded in other alternative areas P47 of the divided areas. At least last data (symbol) of the special data is for example the foregoing value 92h. In other words, the DSV of the data itself largely deviates from "0". On the start side (not shown) of the track, other regular data, for example digital audio data, has been is encoded in accordance with the CIRC4 system and recorded.

When a dedicated reproducing apparatus (that will be described later) reproduces data from an optical disc having such a track, the apparatus can normally decode the data in the areas P7 and P47 and outputs reproduced data. In addition, the apparatus can normally reproduce data of the other areas in which data has been encoded in accordance with the CIRC4 system.

Next, with a conventional reproducing apparatus and a conventional recording apparatus, namely a reproducing apparatus or a recording apparatus in accordance with only the CIRC4 system, the case of which data that is read from an optical disc having the track shown in FIG. 12A is copied will be considered. The conventional reproducing apparatus and recording apparatus accord with only the CIRC4 system. Thus, when the conventional reproducing apparatus reads data from the track shown in FIG. 12A of the optical disc and decodes the data, since the data has been encoded in accordance with the CIRC7 system and recorded in the area P7, if the data of the area P7 is decoded, as shown in FIG. 12B, the error flag becomes "1". However, in the area P47, since the special data has been recorded, it can be also normally decoded in accordance with the CIRC4 system. Thus, the error flag is not set. In other words, the value of the error flag is varied as shown in FIG. 12B in accordance with the CIRC systems of data in the areas P7 and P47.

Thus, the conventional reproducing apparatus outputs data as shown in FIG. 12C. In other words, while a signal is being read from the area P47, the special data in the area P47 is normally decoded and output. In contrast, while data is being read from the area P7, data that has been encoded in accordance with the CIRC7 system cannot be decoded. Because of an error, an interpolated value is output. If data is interpolated in accordance with the pre-hold interpolating method, the immediately preceding normal value, namely the last value that has been normally decoded from the special data of the area P47, in this case, the value 92h is output. While a signal is being read from the area P7, the values 92h are successively output as interpolated values or interpolated data. In the EFM modulating system, connection bits of three bits are inserted into a boundary between two adjacent data symbols. With the connection bits properly selected, the DSV is controlled.

Reproduction output data shown in FIG. 12C is copied to a recordable optical disc such as a CD-R disc. As a result, when data is reproduced from a copied optical disc, the DSV varies in the areas P7 and P47 as shown in FIG. 12D. In other words, since data has been normally copied in the area P47 of the optical disc, the DSV does not largely increase or decrease. However, since the data in the area P7 is a sequence of for example values 92h, only particular connection bits can be selected. Thus, the DSV cannot be controlled so that it approaches 0. As a result, the DSV simply increases for each data symbol.

When the DSV increases while data in the area P7 is being demodulated, the DSV deviates from a predetermined range. As a result, data copied as shown in FIG. 12C cannot be reproduced. In other words, data cannot be substantially copied to a recordable optical disc.

Since the appearance of an original optical disc is very similar to the appearance of a copied optical disc, it is difficult to distinguish them with their appearances. However, when data in the area P47 is decoded in accordance with the CIRC4 system and the CIRC7 system, it can be determined whether the optical disc is an original optical disc or a copied optical disc with the decoded result.

(4) Optical Disc According to Present Invention

FIG. 13A shows an example of an optical disc according to the present invention. FIG. 13A shows an enlarged track on an optical disc according to the present invention. On the optical disc according to the present invention (hereinafter simply referred to as optical disc), a first lead-in area L1, a first main data area PA1, and a first lead-out area LO1 are successively formed in a concentric circular shape from the inner periphery side to the outer periphery side. On the outer periphery side of the first lead-out area LO1, a second lead-in area LI2, a second main data area PA2, and a second lead-out area LO2 are successively and outwardly formed in a concentric circular shape. Tracks are spirally and successively formed from the first lead-in area LI1 to the second lead-out area LO2.

In the first lead-in area LI1, the first main data area PA1, and the first lead-out area LO1, data is recorded in accordance with for example the CD-DA standard. In the first main data area PA1, as main data, digital audio data that has been encoded with an error correction code in accordance with the CD-DA standard like a conventional CD is recorded.

In the second lead-in area LI2, the second main data area PA2, and the second lead-out area LO2, digital audio data that has been encrypted and compressed is recorded. As shown in FIG. 13A, the second main data area PA2 is divided into four areas PA21 to PA24.

In the third divided area PA23 of the second main data area PA2, digital audio data that has been compressed in accordance with for example MP-3 (MPEG-1 Audio Layer 3) system or ATRAC (Adaptive Transform Acoustic Coding: registered trademark), encrypted, and encoded in accordance with the CIRC4 system is recorded. In the first divided area PA21 of the second main data area PA, a decrypting program that decrypts digital audio data recorded in the third divided area PA23, decompresses the decoded data, and obtains original digital audio data, namely data of so-called reproducing software, that has been encoded in accordance with the CIRC4 system is recorded.

In the second divided area PA22 of the second main data area PA2, key data K22 with which the encrypted digital audio data recorded in the third divided area PA23 is decrypted is encrypted with key data K24 that will be described later and that has encoded in accordance with the CIRC4 system is recorded. In the fourth divided area PA24 of the second main data area PA2, key data K24 with which the key data K22 recorded in the second divided area PA22 is decrypted is recorded.

As shown in FIG. 13B, the fourth divided area PA24 is also divided into a plurality of areas. In an area P47 of the divided areas, the key data K24 or dummy data is recorded as the special data described in section (1). In an area P7 of the divided areas, data that has been encoded in accordance with the CIRC7 system is recorded so that when the data is decoded in accordance with the CIRC4 system, an error takes place. In other words, the last symbol of the key data K24 or dummy data recorded in the area P47 is "92h".

When the data in the fourth divided area PA24 is decoded in accordance with the CIRC4 system, since the key data K24 or dummy data has been recorded as the special data in the area P47, the key data K24 or dummy data recorded in the area P47 can be normally decoded. Thus, as shown in FIG. 13C, the error flag is not set. However, since data recorded in the area P7 has been encoded in accordance with the CIRC7 system, when the data is decoded in accordance with the CIRC4 system, an error takes place. Thus, as shown in FIG. 13C, the error flag is set.

In other words, as shown in FIG. 13C, the error flag varies in accordance with the CIRC system of the data recorded in the forth area PA24. The error flag values "0" and "1" can be freely set depending on whether data is recorded as the special data that can be decoded in accordance with any of the CIRC4 system and the CIRC7 system or as data that is encoded in accordance with the CIRC7 system. In other words, to set the error flag to 0, the key data K24 and dummy data are recorded as the special data. To set the error flag to 1, any data is encoded in accordance with the CIRC7 system and recorded.

According to the present invention, the arrangement pattern of the error flag values "0" and "1" is a part of the key data K24. The areas P7 and P47 are formed so that the arrangement pattern of the error flag values "0" and "1" and the key data recorded in the area P47 compose the key data K24.

The standard about physical dimensions and characteristics such the diameter and thickness of the optical disc is based on the current standard of the CD.

On the optical disc formed in the foregoing manner, data recorded in the first main data area PA1 can be reproduced as digital audio data by a conventional reproducing apparatus in accordance with the CIRC4 system, namely a CD player, a CD-ROM drive device, or the like.

Data recorded in the second main data area PA2 can be reproduced by a dedicated reproducing apparatus that will be described later. In this case, key data K24 is generated or decrypted with an error flag of which data recorded in the fourth area PA24 is decoded, for example data in accordance with an error flag shown in FIG. 13C, and key data read from the area P47. With the decrypted key data K24, the key data K22 recorded in the second divided area PA22 can be decrypted. Thus, with the decrypted key data K22 and data of the reproducing program that is read from the first divided area PA21, digital audio data in the third divided area PA23 can be decrypted and decompressed. As a result, original digital audio data, namely non-encrypted digital audio data, can be obtained from the data that is read from the second main data area PA2 of the optical disc.

On the other hand, even if data recorded on the optical disc shown in FIG. 13A is tried to be copied, as described in section (3), the data cannot be substantially copied.

Even if data recorded on the optical disc shown in FIG. 13A can be copied to a recordable optical disc, for example a CD-R disc, as shown in FIG. 13D, since the last symbol of the special data of the area P47 of the second main data area PA2 of the recordable optical disc as a copied disc is "92h", an error that will take place in the area P7 is interpolated and data of "92h" is recorded as a decoded result of data that is read from the area P7. In other words, as shown in FIG. 13D, data that can be decoded in accordance with the CIRC4 system is recorded to an optical disc as a copied disc.

Thus, even if data recorded on a copied optical disc is decoded in accordance with the CIRC4 system, data about the error flag that varies as shown in FIG. 13C cannot be obtained. Thus, a part of the key data K24 cannot be obtained. As a result, since the key data K24 cannot be obtained, the key data K22 cannot be decrypted. Consequently, the digital audio data recorded in the third divided area PA23 cannot be decrypted. Thus, the digital audio data recorded in the second main data area PA2 cannot be substantially copied. At that point, as described above, when data in the fourth divided area PA24 is being decoded or reproduced, the DSV increases. As a result, data cannot be reproduced from a copied optical disc. Even if data can be reproduced from the optical disc, as described above, the key data K24 cannot be obtained.

(5) Recording Apparatus of Present Invention

FIG. 14 shows an example of a recording apparatus for the optical disc according to the present invention described in section (4). In other words, when data is recorded in the first main data area PA1, a system controlling circuit 45 causes switch circuits 32 and 35 to be connected to terminals 32a and 35a as shown in FIG. 14, respectively. Main data such as digital audio data is supplied to a CIRC4 encoder circuit 34 through an input terminal 31 and the switch circuit 32. The CIRC4 encoder circuit 34 performs an encoding process for the main data in accordance with the CIRC4 system. Output data of the encoded output of the CIRC4 encoder circuit 34 is supplied to a sub code encoder circuit 37 through the switch circuit 35.

Sub code data is supplied from the controlling circuit 45 to the sub code encoder circuit 37. In this case, the sub code data contains information that represents the positions of the first divided area PA21 to the fourth divided area PA24 shown in FIG. 13A, for example address information thereof. In such a manner, the sub code encoder circuit 37 outputs encoded data to which a sub code is output.

The encoded data is supplied to an EFM modulating circuit 38. The EFM modulating circuit 38 outputs an EFM modulated signal (channel bits). The signal is supplied to a recording optical head 41 through a recording amplifier 39. The recording optical head 41 records the signal as spiral tracks in the first main data area PA1 of a recordable optical disc or an original (simply referred to as optical disc) 50. At that point, the optical disc 50 is rotated at a predetermined linear velocity by a spindle motor 42. In addition, a servo circuit 43 performs various types of servo controls for a recording operation such as focus servo, tracking servo, and servo for record current supplied to the optical head 41.

As described in section (4) and FIG. 13A, main data is encoded in accordance with the CIRC4 system and recorded in the first main data area PA1 of the optical disc 50.

When data is recorded in the second main data area PA2, data about the reproducing software is supplied to the CIRC4 encoder circuit 34 through the input terminal 31 and the switch circuit 32. The CIRC4 encoder circuit 34 performs an encoding process for the data in accordance with the CIRC4 system. Output data as encoded output of the CIRC4 encoder circuit 34 is supplied to the EFM modulating circuit 38 through the switch circuit 35 and the sub code encoder circuit 37. An EFM modulated signal that is output from the EFM modulating circuit 38 is supplied to the optical head 41 through the recording amplifier 39. The optical head 41 records the signal in the first divided area PA21 of the second main data area PA2.

Thereafter, the controlling circuit 45 outputs the key data K22 encrypted with the key data K24. The key data K22 is supplied to the CIRC4 encoder circuit 34. The CIRC4 encoder circuit 34 performs an encoding process for the key data K22 in accordance with the CIRC4 system. Output data as an encoded output of the CIRC4 encoder circuit 34 is supplied to the EFM modulating circuit 38 through the switch circuit 35 and the sub code encoder circuit 37. The EFM modulated signal that is output from the EFM modulating circuit 38 is supplied to the optical head 41. The optical head 41 records the EFM modulated signal in the second divided area PA22 of the second main data area PA2.

In addition, the controlling circuit 45 causes the switch circuit 32 to be connected to the terminal 32b. In addition, the key data K22 is supplied from the controlling circuit 45 to an encrypting circuit 33. Main data such as digital audio data that has been compressed in accordance with the foregoing system is supplied to the encrypting circuit 33 through the input terminal 31. The encrypting circuit 33 encrypts the main data with the key data K22. Output data of the encrypting circuit 33 is supplied to the CIRC4 encoder circuit 34 through the switch circuit 32. The CIRC4 encoder circuit 34 performs an encoding process for the data in accordance with the CIRC4 system. Output data as an encoded output of the CIRC4 encoder circuit 34 is supplied to the EFM modulating circuit 38 through the switch circuit 35 and the sub code encoder circuit 37. An EFM modulated signal that is output from the EFM modulating circuit 38 is supplied to the optical head 41. The recording optical head 41 records the EFM modulated signal in the third divided area P23 of the second main area data area PA2.

The key data K24, the dummy data, and the data for the area P7 are supplied from the controlling circuit 45 to an encoder circuit 36 in predetermined length S and a predetermined order. The encoder circuit 36 performs an encoding process for the data as the special data or in accordance with the CIRC7 system. Output data as an encoded output of the encoder circuit 36 is supplied to the EFM modulating circuit 38 through the switch circuit 35 and the sub code encoder circuit 37. At that point, the modulating circuit 38 modules the output data of the encoder circuit 36 so that the last data symbol of the key data or dummy data recorded in the area P47 shown in FIG. 13 becomes "92h". An EFM modulated signal that is output from the EFM modulating circuit 38 is supplied to the optical head 41. The recording optical head 41 records the EFM modulated signal in the fourth divided area P24 of the second main area data area PA2 as shown in FIG. 13B and C. Sub code data recorded in the second main data area P24 contains information that represents the position of the fourth divided area P24, for example address information thereof. The switch circuit 35 is connected to the terminal 35b with a control signal supplied from the controlling circuit 45.

In the foregoing manner, data is recorded on the optical disc 50. Thus, as described in section (4) and FIG. 13A to FIG. 13B, main data, key data, special data, and so forth are recorded in respective areas. When the optical disc 50 is an original, with the original on which data has been recorded, namely that has been exposed, a stamper is produced. With the stamper, a disc substrate is formed by an injection forming method or the like. A reflection film made of Al or the like is coated on a disc substrate. As a result, a read-only optical disc can be produced.

(6) Reproducing Apparatus According to Present Invention

FIG. 15 shows an example of a reproducing apparatus that reproduces data from the optical disc 50 on which the data has been recorded by the recording apparatus described in section (5). In this case, a reproducing optical head 71 reads data from the optical disc 50. A spindle motor 62 rotates the optical disc 50 at a predetermined linear velocity. A servo circuit 63 controls various types of servo controls for a reproducing operation such as focus servo and tracking servo for the optical disc 50.

When data is reproduced from the first main data area PA1 of the optical disc 50, an output signal of the optical head 61 is supplied to an EFM demodulating circuit 72 through a reproducing amplifier 71. The EFM demodulating circuit 72 performs a demodulating process for the output signal of the optical head 61. An output signal of the EFM demodulating circuit 72 is supplied to a CIRC4 decoder circuit 73. The CIRC4 decoder circuit 73 performs a decoding process, namely an error detecting process and an error correcting process, for the output signal of the EFM demodulating circuit 72 in accordance with the CIRC4 system. Digital audio data is output from the decoder circuit 73. A controlling circuit 65 causes a switch circuit 74 to be connected to a terminal 74a. After the CIRC4 decoder circuit 73 has decoded the digital audio data, the digital audio data is output to the outside of the apparatus from an output terminal 75 through the switch circuit 74.

A part of the demodulated output data of the EFM demodulating circuit 72 is supplied to a sub code decoder circuit 78. The sub code decoder circuit 78 extracts sub code data from the part of the demodulated output data. The sub code data is supplied to the system controlling circuit 65. The controlling circuit 65 obtains information that represents the positions of the first divided area PA21 to the fourth divided area PA24 of the second main data area PA2, namely address information (FIG. 13A), from the supplied sub code data.

When data is reproduced from the second main data area PA2 of the optical disc 50, the controlling circuit 65 causes the optical head 61 to access the fourth divided area PA24 in accordance with the sub code data. The optical head 61 reads data from the fourth divided area PA24 of the second main data area PA2. The data is supplied to the EFM demodulating circuit 72. As shown in FIG. 13B, the EFM demodulating circuit 72 demodulates the data that has been read from the fourth divided area PA24 and outputs the demodulated data to the CIRC4 decoder circuit 73.

Thus, data corresponding to the error flag that varies as shown in FIG. 13C is output from the CIRC4 decoder circuit 73. Data corresponding to the error flag is supplied as a part of the key data K24 to the controlling circuit 65. The CIRC4 decoder circuit 73 performs a decoding process for the data recorded in the area P47 in accordance with the CIRC4 system. The decoded output data is supplied to an extracting circuit 77. The extracting circuit 77 extracts data of the key data K24 from the decoded data. The extracted data is supplied to the controlling circuit 65. The restores the key data K24 from the decoded data with data in accordance with both the error flag supplied from the CIRC4 decoder circuit 73 and the data extracted by the extracting circuit 77.

Thereafter, the optical head 61 reads data about the reproducing software from the first divided area PA21 of the second main data area PA2 of the optical disc 50 by the optical head 61. The data is successively supplied to the EFM demodulating circuit 72 and the CIRC4 decoder circuit 73. As a result, the CIRC4 decoder circuit 73 decodes the data about the reproducing software and outputs the decoded data about the reproducing software. The decoded data about the reproducing software is supplied to a decrypting circuit 76 through the controlling circuit 65.

In addition, the optical head 61 reads the encrypted key data K22 from the second divided area PA22 of the second main data area PA2 of the optical disc 50. The encrypted key data K22 is successively supplied to the EFM demodulating circuit 72 and the CIRC7 decoder circuit 77. The CIRC7 decoder circuit 77 decodes the encrypted key data K22 and outputs the decoded encrypted key data K22. The decoded encrypted key data K22 is supplied to the controlling circuit 65. The controlling circuit 65 decrypts the encrypted key data K22 with the key data K24. The decrypted key data K22 is supplied to a decrypting circuit 76.

The optical head 61 reads data from the third divided area PA23 of the second main data area PA2 of the optical disc 50. The data is successively supplied to the EFM demodulating circuit 72 and the CIRC4 decoder circuit 73. The EFM demodulating circuit 72 and the CIRC4 decoder circuit 73 decode the compressed and encrypted digital data. The decoded data is supplied to the decrypting circuit 76.

The decrypting circuit 76 decrypts and decompresses the digital data with the key data K24 and the data about the reproducing software supplied from the controlling circuit 65. As a result, original digital audio data is obtained. The controlling circuit 65 causes the data to be output to the outside of the apparatus from the output terminal 75 through the switch circuit 74 connected to the terminal 74b.

In such a manner, digital audio data recorded in the first main data area PA1 and the second main data area PA2 of the optical disc 50 is output as a reproduced output from the output terminal 75.

(7) Others

In the foregoing description, the fourth divided area P24 of the optical disc 50 is divided into the area P7 in which data that has been encoded in accordance with the CIRC7 system is recorded and the area P47 in which data as the special data is recorded. Alternatively, a whole track may be structured as the fourth divided area PA24 in which digital audio data and so forth are recorded. In the foregoing description, the processes for the CIRC4 system and the CIRC7 system described with reference to FIG. 13A to FIG. 15 may be reversed. In addition, as long as interleave lengths of two CIRC system are different, the present invention can be applied to other than the CIRC4 system and the CIRC7 system. The reproducing order of the first divided area P21 to the fourth divided area P24 shown in FIG. 13A and FIG. 13B can be changed.

In addition, in the foregoing description, as the recording medium, an optical disc in accordance with the CD standard was exemplified. Alternatively, the recording medium may be a Mini Disc, a DVD, or the like. Alternatively, data may be transmitted or received through a network such as the Internet. When a synchronous pattern is placed at the beginning of each of the first divided area PA21 to the fourth divided area PA24, the positions of data that has been read can be accurately obtained.

The invention claimed is:

1. A recording medium comprising:
   a first area in which data that has been encoded with a first error correction code is recorded; and
   a second area having recorded therein data encoded with the first error correction code and data that is decodable with a second error correction code that is different from the first error correction code,
   wherein data is recorded in the second area that causes a cumulated value of a DC component per unit period of data reproduced from the second area to deviate.

2. The recording medium as set forth in claim 1,
   wherein the data decodable with the second error correction code contains the data decodable with the first error correction code, and
   wherein the data that causes the cumulated value of the DC component to deviate is contained in the data decodable with the first error correction code.

3. The recording medium as set forth in claim 2,
   wherein the data recorded in the first area and encoded with the first error correction code has been encrypted with at least encryption key data, and
   wherein the data decodable with the second error correction code includes at least a part of the encryption key data.

4. The recording medium as set forth in claim 3,
   wherein the data decodable with the first error correction code is placed in the data decodable with the second error correction code so that when the data decodable with the second error correction code is decoded with the first error correction code, the data decodable with the first error correction code represents a predetermined error pattern in accordance with the encryption key data.

5. The recording medium as set forth in claim 4,
   wherein at least part of the data decodable with the first error correction code is dummy data.

6. The recording medium as set forth in claim 1,
   wherein information that represents a position of the second area is recorded on the recording medium.

7. A recording method, comprising the steps of:
recording data that has been encoded with a first error correction code to a first area of a recording medium;
recording data in the second area encoded with the first error correction code and data that is decodable with a second error correction code that is different from the first error correction code to a second area of the recording medium; and
recording data that causes a cumulated value of a DC component per unit period of data reproduced from the second area to deviate to the second area.

8. The recording method as set forth in claim 7,
wherein the data decodable with the second error correction code contains the data decodable with the first error correction code, and
wherein the third recording step is performed so that the data that causes the cumulated value of the DC component to deviate is contained in the data decodable with the first error correction code.

9. The recording method as set forth in claim 8,
wherein the first recording step is performed so that the data recorded in the first area and encoded with the first error correction code has been encrypted with at least encryption key data, and
wherein the data decodable with the second error correction code includes at least a part of the encryption key data.

10. The recording method as set forth in claim 9,
wherein the second recording step is performed by placing the data decodable with the first error correction code in the data decodable with the second error correction code so that when the data decodable with the second error correction code is decoded with the first error correction code, the data decodable with the first error correction code represents a predetermined error pattern in accordance with the encryption key data.

11. The recording method as set forth in claim 10,
wherein at least part of the data decodable with the first error correction code is dummy data.

12. The recording method as set forth in claim 7, further comprising:
recording information that represents a position of the second area to the recording medium.

13. A recording apparatus, comprising:
a first encoding process portion configured to perform an encoding process including an error correction code encoding process for data that is inputs, with a first error correction code;
a second encoding process portion configured to perform a second encoding process including an error correction code encoding process with a second error correction code that is different from the first error correction code;
a modulating process portion configured to receive output data of the first encoding process portion and output data of the second encoding process portion, and configured to perform a modulating process for the output data of the first encoding process portion and the output data of the second encoding process portion, and performing a modulating process for modulating the output data of the second encoding process portion so that data that causes a cumulated value of a DC component per unit period of the output data of the second encoding process portion to deviate is contained in the output data of the second encoding process portion; and
a recording portion configured to receive output data of the modulating process portion and mixedly recording configured to record data in a second area encoded with the first error correction code and data decodable with the second error correction code, which is different from the first error correction code.

14. The recording apparatus as set forth in claim 13,
wherein the second encoding process portion is configured to perform the error correction code encoding process with the second error correction code and perform an encoding process for data decodable with any of the first error correction code and the second error correction code.

15. The recording apparatus as set forth in claim 14,
wherein the modulating process portion is configured to perform the modulating process so that data decodable with any of the codes supplied from the second encoding process portion contains the data that causes the cumulated value of the DC component per unit period of the output data of the second encoding process portion to deviate.

16. The recording apparatus as set forth in claim 13, further comprising:
a recording control portion configured to control the recording portion so that the data in the second area encoded with the first error correction code and the data decodable with the second error correction code different from the first error correction code are recorded, and
wherein the recording control portion is configured to cause the data decodable with the second error correction code to include at least a part of the encryption key data.

17. The recording apparatus as set forth in claim 16,
wherein the recording control portion is configured to record the data decodable with any of the codes in the data decodable with the second error correction code so that when the data decodable with the second error correction code is decoded with the first error correction code, the data decodable with any of the codes represents a predetermined error pattern in accordance with the encryption key data.

18. The recording apparatus as set forth in claim 17,
wherein a part of the data decodable with any of the codes is dummy data.

19. The recording apparatus as set forth in claim 13,
wherein information that represents a position of an area in which the data in the second area encoded with the first error correction code and the data decodable with the second error correction code different from the first error correction code are recorded.

20. A reproducing apparatus, comprising:
a head portion configured to read data from a recording medium having a first area on which data that has been encoded with a first error correction code is recorded and a second area on which data in the second area encoded with the first error correction code and data that is decodable with a second error correction code that is different from the first error correction code are recorded, wherein data that causes a cumulated value of a DC component per unit period of data reproduced from the second area to deviate is recorded in the second area;
a decoding process portion configured to perform a decoding process for data that has been read from the head portion;

an error correcting process portion configured to perform an error correcting process for output data of the decoding process portion, with the first error correction code;

a generating portion configured to decrypt key data in accordance with a process result of the error correcting process portion; and a decrypting portion for decrypting encrypted data that has been read from the first area and that has been output from the decoding process portion with the key data decrypted by the generating portion.

21. The reproducing apparatus as set forth in claim 20, wherein an encrypting process has been performed for the data in the second area encoded with the first error correction code recorded on the recording medium in accordance with the key data, wherein the key data has been recorded on the recording medium, and wherein the generating portion is configured to generate other key data for which the other key data is decrypted with an error pattern decoded with the first error correction code and configured to decrypt the key data with the other key data.

22. The reproducing apparatus as set forth in claim 21, wherein information that represents a position of the second area has been recorded on the medium, and wherein the reproducing apparatus is configured to control the position of the head portion in accordance with the information representing the position so as to read the data of the second area.

23. A reproducing method, comprising:

reading data from a recording medium having a first area on which data that has been encoded with a first error correction code is recorded and a second area on which data in the second area encoded with the first error correction code and data that is decodable with a second error correction code that is different from the first error correction code are recorded, wherein data that causes a cumulated value of a DC component per unit period of data reproduced from the second area to deviate is recorded in the second area;

decoding data that has been read;

error correcting data that has been decoded with the first error correction code;

decrypting key data in accordance with a process result of the error correcting process; and decrypting encrypted data that has been read from the first area with the decrypted key data.

24. The reproducing method as set forth in claim 23, wherein an encrypting process has been performed for the data in the second area encoded with the first error correction code recorded on the recording medium in accordance with the key data, wherein the key data has been recorded on the recording medium, and wherein the decrypting includes generating other key data for which the other key data is decrypted with an error pattern decoded with the first error correction code and decrypting the key data with the other key data.

25. The reproducing method as set forth in claim 24, wherein information that represents a position of the second area has been recorded on the medium, and wherein the reproducing method further comprises reading the data of the second area in accordance with the information representing the position.

* * * * *